(12) United States Patent
Miller et al.

(10) Patent No.: US 10,977,875 B2
(45) Date of Patent: Apr. 13, 2021

(54) SYSTEMS AND METHODS FOR VEHICLE DIAGNOSTIC TESTER COORDINATION

(71) Applicant: Ford Global Technologies, LLC, Dearborn, MI (US)

(72) Inventors: Jason Michael Miller, Woodhaven, MI (US); William Robert Waldeck, Plymouth, MI (US); Eric Ramsay Paton, Sylvan Lake, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 653 days.

(21) Appl. No.: 15/818,511

(22) Filed: Nov. 20, 2017

(65) Prior Publication Data

US 2019/0156592 A1 May 23, 2019

(51) Int. Cl.
| | |
|---|---|
| *G07C 5/00* | (2006.01) |
| *G07C 5/08* | (2006.01) |
| *H04L 29/08* | (2006.01) |
| *G01R 31/00* | (2006.01) |
| *B60R 16/023* | (2006.01) |
| *H04W 4/48* | (2018.01) |

(52) U.S. Cl.
CPC .......... *G07C 5/008* (2013.01); *B60R 16/0234* (2013.01); *G01R 31/006* (2013.01); *G07C 5/0808* (2013.01); *H04L 67/12* (2013.01); *H04W 4/48* (2018.02); *G07C 5/006* (2013.01)

(58) Field of Classification Search
CPC .. G07C 5/008; G07C 5/0808; G07C 2205/02; H04W 4/48; B60R 16/0234; G01R 31/006; H04L 67/12

USPC ................................................ 701/29.1, 31.4
See application file for complete search history.

(56) References Cited

U.S. PATENT DOCUMENTS

| | | | |
|---|---|---|---|
| 7,869,906 B2 | 1/2011 | Louch et al. | |
| 8,676,437 B2 | 3/2014 | Yamada | |
| 9,489,544 B2 | 11/2016 | Naitou et al. | |
| 2006/0202799 A1* | 9/2006 | Zambo | G07C 9/00817 |
| | | | 340/5.72 |
| 2007/0198147 A1 | 8/2007 | Keith et al. | |
| 2010/0205450 A1 | 8/2010 | Sarnacke | |
| 2010/0293081 A1 | 11/2010 | Liu | |
| 2011/0118933 A1 | 5/2011 | Sakai | |
| 2011/0258431 A1 | 10/2011 | Gundavelli | |
| 2013/0031212 A1 | 1/2013 | Enosaki | |
| 2013/0219170 A1 | 8/2013 | Naitou | |

(Continued)

FOREIGN PATENT DOCUMENTS

| | | |
|---|---|---|
| CN | 101456392 B | 7/2011 |
| CN | 102346472 A | 2/2012 |

(Continued)

*Primary Examiner* — Isaac G Smith
(74) *Attorney, Agent, or Firm* — Frank Lollo; Eversheds Sutherland (US) LLP

(57) ABSTRACT

Method and apparatus are disclosed for coordinating multiple vehicle diagnostic testers. An example vehicle includes an off-board diagnostic tester port, an in-vehicle diagnostic (IVD) tester, and a gateway module. The gateway module is configured to enable communication with the IVD tester, determine that a diagnostic tool is coupled to the off-board diagnostic tester port for greater than a threshold number of ignition cycles, and responsively prevent communication with the off-board diagnostic tester port.

20 Claims, 3 Drawing Sheets

(56) References Cited

U.S. PATENT DOCUMENTS

| | | |
|---|---|---|
| 2014/0036693 A1 | 2/2014 | Mabuchi |
| 2015/0372975 A1 | 12/2015 | Moriya |
| 2016/0012653 A1 | 1/2016 | Soroka |
| 2017/0026196 A1 | 1/2017 | Miners et al. |
| 2017/0036645 A1* | 2/2017 | Boran ................ G07C 5/0808 |
| 2017/0167952 A1* | 6/2017 | Hiroi ..................... F02D 41/28 |
| 2018/0072250 A1 | 3/2018 | Kim |
| 2018/0225891 A1* | 8/2018 | Lambourne .......... G01R 31/007 |

FOREIGN PATENT DOCUMENTS

| | | |
|---|---|---|
| CN | 102354196 B | 6/2016 |
| JP | 2002077196 A | 3/2002 |
| JP | 2004192277 A | 7/2004 |
| WO | WO 2017023311 A1 | 2/2017 |

\* cited by examiner

SYSTEMS AND METHODS FOR VEHICLE DIAGNOSTIC TESTER COORDINATION

CROSS REFERENCE TO RELATED APPLICATION

This application is related to application Attorney Docket Number 026780-8951, filed on Nov. 20, 2017. The related application is hereby incorporated by reference in its entirety.

TECHNICAL FIELD

The present disclosure generally relates to vehicle system diagnostics and, more specifically, systems and methods for in-vehicle and off-board diagnostic tester coordination.

BACKGROUND

Modern vehicles may include many systems related to movement, power control, lighting, passenger comfort, and more. These systems are often electronically coupled together using a communication bus, so that one or more systems may issue commands, request information, and otherwise access data or information gathered by the various system.

Diagnostic information may be gathered, and used by one or more systems to provide indications to a driver (e.g., warning lights) as well as to provide information about the status of the various systems (e.g., emissions data, vehicle computer health, etc.).

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown describing systems, apparatuses, and methods for coordinating diagnostic testers of a vehicle communication network. An example disclosed vehicle includes an off-board diagnostic tester port, an in-vehicle diagnostic (IVD) tester, and a gateway module. The gateway module is configured to enable communication with the IVD tester, determine that a diagnostic tool is coupled to the off-board diagnostic tester port for greater than a threshold number of ignition cycles, and responsively prevent communication with the off-board diagnostic tester port.

An example disclosed method for controlling diagnostic testers of a vehicle includes enabling, by a gateway module, communication with an in-vehicle diagnostic (IVD) tester. The method also includes determining, by the gateway module, that a diagnostic tool is coupled to an off-board diagnostic tester port for greater than a threshold number of ignition cycles. And the method further includes responsively preventing communication with the off-board diagnostic tester port.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
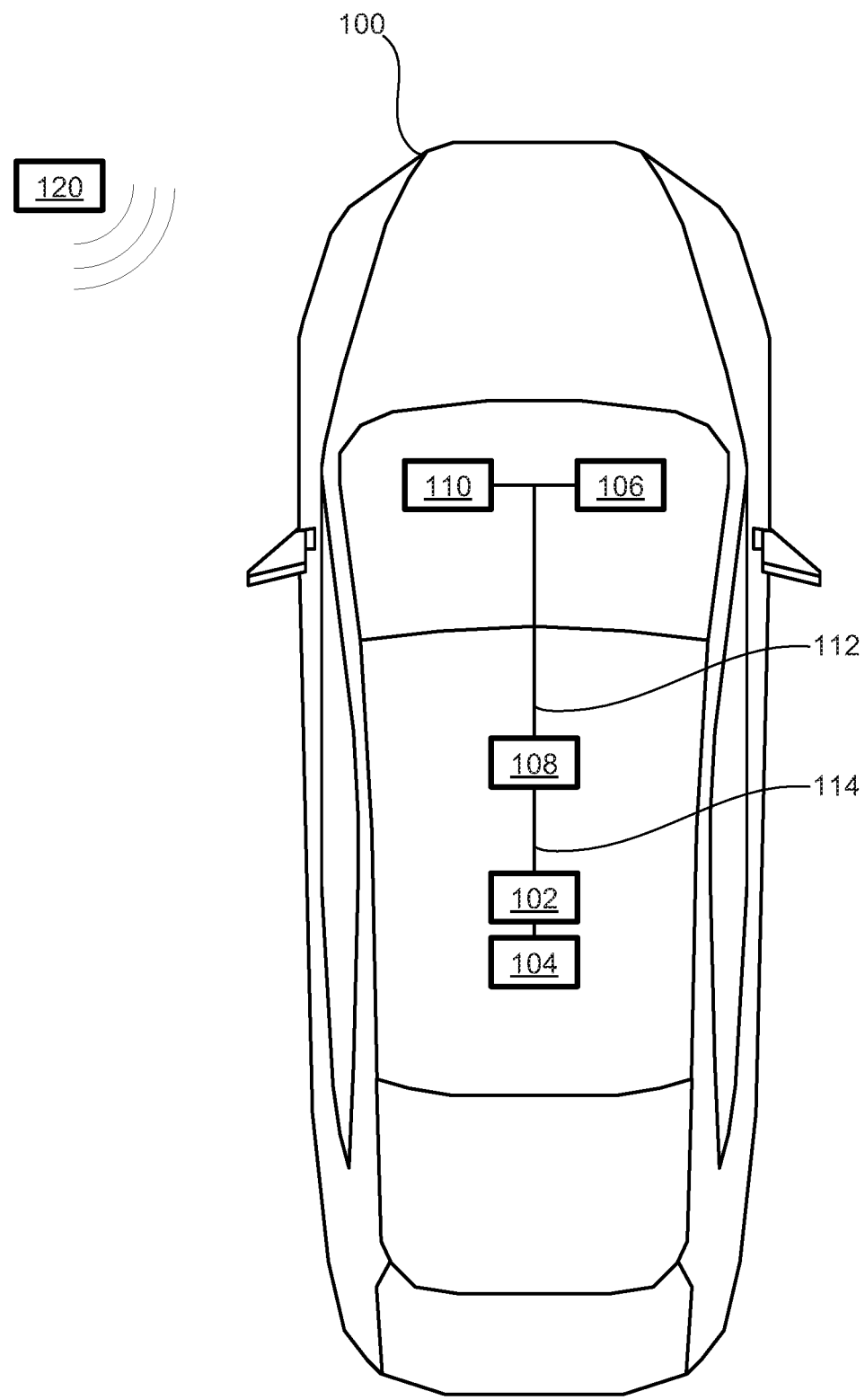
FIG. 1 illustrates an example vehicle according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, vehicles may include one or more systems or devices configured to collect information about the vehicle, and provide that information for use by one or more other systems or devices. Some such systems may be called on-board or in-vehicle diagnostic (IVD) testers. These IVD testers may be internal vehicle components configured to monitor the status of one or more vehicle systems, in order to provide warnings and alerts to the driver or other parties. A given vehicle may have a plurality of IVD testers, each configured to monitor and/or provide alerts for specific scenarios.

Vehicles may also include an off-board diagnostic tester port into which a diagnostic tool can be plugged. The diagnostic tool may be an aftermarket tool, such as a vehicle insurance company plug-in that can be used to monitor speeds, vehicle usage, and other vehicle characteristics. Other example diagnostic tools may include emissions testing tools, manufacturer or maintenance tools, legally required vehicle operation tools, and more.

Vehicles may further include electronic control units (ECUs) that are configured to gather vehicle information via sensors, control various vehicle systems, and otherwise interact with other systems and devices on the vehicle communication network.

Some vehicles communication networks may include a plurality of distinct communication buses, that each are configured to allow communication between one or more ECUs, IVD testers, diagnostic tools, and other systems or devices. These communication buses (in addition to the various computing systems and devices) may be configured to operate using a CAN protocol.

Within the framework of devices and systems described above (and elsewhere within this disclosure), problems may arise due to the fact that the communication framework may only allow one diagnostic tester to communicate with an ECU at a given time. As such, if two or more diagnostic testers request access to the same ECU, problems may arise. Further, if one diagnostic tester requests constant access to an ECU, it may prevent other diagnostic testers from requesting and receiving information.

An additional communication network limitation may include that an off-board diagnostic tester port of many vehicles is hardwired to one or more communication buses, meaning that when a diagnostic tool is plugged in to the port, it is not possible to prevent the diagnostic tool from requesting information from various ECUs on the various communication buses to which it is hardwired. As such, if the diagnostic tool requests information while an ECU is providing information to a different diagnostic tester, confusion may occur leading to communication problems, lost or mixed up information requests, and even a shutdown of the communication network.

These issues may be particularly apparent in a case where a diagnostic tool is plugged in or coupled to an off-board diagnostic tester port during normal operation of the vehicle, such as an insurance dongle, GPS unit for monitoring the vehicle location, or other permanent or semi-permanent plug in diagnostic tool. These diagnostic tools may constantly requests access to vehicle information from one or more ECUs, interfering with in-vehicle diagnostic tester communication requests that occur as part of normal vehicle operation. For example, one or more in-vehicle diagnostic testers may be used while the vehicle is in motion to check for error codes or other faults that should be reported to the driver, such that he or she can take corrective action and ensure the vehicle is safely operated. If these in-vehicle diagnostic testers are unable to operate properly, the driver may not be made aware of important safety concerns.

With the above described issues in mind, examples disclosed herein may include providing an network or communication architecture that enables multiple in-vehicle diagnostic (IVD) testers and an off-board diagnostic tool plugged in to a port to coexist and operate without causing communication errors or interfering with each other. A gateway module may act to coordinate IVD tester and off-board diagnostic tool requests, while maintaining the ability to allow emissions tools, manufacturing or maintenance tools, and other tools to operate properly. Examples herein may determine one or more characteristics of a plugged in diagnostic tool, in order to determine whether to block or prevent the tool from accessing one or more ECUs for a period of time. By preventing or blocking the tool, in-vehicle testers may be able to request and receive information to allow them to operate properly as well.

FIG. 1 illustrates an example vehicle 100 according to embodiments of the present disclosure. Vehicle 100 may be a standard gasoline powered vehicle, a hybrid vehicle, an electric vehicle, a fuel cell vehicle, or any other mobility implement type of vehicle. Vehicle 100 may be non-autonomous, semi-autonomous, or autonomous. Vehicle 100 may include parts related to mobility, such as a powertrain with an engine, a transmission, a suspension, a driveshaft, and/or wheels, etc. In the illustrated example, vehicle 100 may include one or more electronic components (described below with respect to FIG. 2).

As shown in FIG. 1, vehicle 100 may include an off-board diagnostic tester port 102 into which a diagnostic tool 104 may be plugged, an in-vehicle diagnostic tester 106, a gateway module 108, and an ECU 110, which may be communicatively coupled via communication buses 112 and 114.

Off-board diagnostic tester port 102 may include a SAE J1962 connector having multiple pins configured to couple to a diagnostic tool, such as tool 104. The off-board diagnostic tester port 102 may be coupled to gateway module 108 via a communication bus 114. Diagnostic tool 104 may be any device configured to plug in or be coupled to off-board diagnostic tester port 102. For examples, diagnostic tool 104 may be an insurance device (such as a PROGRESSIVE™ dongle, a location device configured to monitor the vehicle location via GPS, or another tool. Each tool may be configured to request and receive information from various vehicle ECUs, such as vehicle speed, acceleration, location, and other types of information determined by vehicle sensors.

In some examples, the diagnostic tool may be configured to request access to information from one or more ECUs multiple times per second. The gateway module may be configured to grant access to only one diagnostic tester at a time (e.g., either the diagnostic tool or an IVD tester). And the gateway module may further be configured to prioritize the diagnostic tool access over the IVD tester access, in order to ensure that any maintenance or manufacturing tool plugged in is not denied access. In these examples, due to the priority of the diagnostic tool over the IVD tester, it may be difficult or impossible for an IVD tester to request and receive information.

IVD tester 106 may include one or more processors and/or memory, and may be configured to request information regarding other vehicle systems, in order to determine whether an error or fault code, alert, or other warning should be provided to the driver or other party. Some IVD testers may be related to vehicle computing system health, vehicle emissions, vehicle engine characteristics, and more. IVD tester 106 may be embedded in vehicle 100 and communicatively coupled to one or more communication buses such that it does not require access to an external port or plug-in to operate. As such, IVD tester 106 may be separate from a plug-in module coupled to the vehicle via an external port 102.

ECU 110 may monitor and control one or more subsystems of vehicle 100. ECU 110 may communicate and exchange information via communication bus 112. Additionally, ECU 106 may communicate properties (such as, status of the ECU 110, sensor readings, control state, error and diagnostic codes, etc.) to and/or receive requests from other ECUs, diagnostic testers, or other systems or devices. Some vehicles may have seventy or more ECUs located in various locations around the vehicle communicatively coupled by vehicle data bus 112. ECU 106 may be a discrete set of electronics that includes its own circuit(s) (such as integrated circuits, microprocessors, memory, storage, etc.) and firmware, sensors, actuators, and/or mounting hardware.

Some example ECUs may include an engine control unit, powertrain control module, body control module, driver seat module, driver door module, anti-lock brake system, telematics control unit, and more. Each ECU may include one or more sensors, systems, or devices configured to gather information about one or more vehicle characteristics particular to the given ECU.

In some examples, each ECU may be configured to receive a request for information, and responsively transmit the requested information via communication bus 112. Further, one or more ECUs may also include an IVD tester, which may be configured to request information from other ECUs for use by the ECU of which it is a part.

Communication buses 112 and 114 may communicatively couple the various systems and devices of vehicle 100, including the IVD tester 10106, off-board diagnostic tester port 102, ECU 110 and gateway module 108. In some examples, communication buses 112 and 114 may be implemented in accordance with the controller area network (CAN) bus protocol as defined by International Standards Organization (ISO) 11898-1. Alternatively, in some examples, communication buses 112 and 114 may be Media Oriented Systems Transport (MOST) buses, or CAN flexible data (CAN-FD) buses (ISO 11898-7). While FIG. 1 illustrates two communication buses, it should be understood that other numbers of communication buses may be used as well.

Gateway module 108 may include one or more processors and/or memory, and may be configured to carry out one or more actions or functions described herein. Where the vehicle includes multiple communication buses, gateway module 108 may be communicatively coupled to all the data buses. This may allow requests from an IVD tester (or diagnostic tool) coupled to a first bus to be distributed to one or more other buses which may be coupled to the particular ECU that is requested by the IVD tester or diagnostic tool. The gateway module may further be configured to deny access to one or more communication buses, thereby preventing one or more IVD testers or the diagnostic tool from communicating.

Gateway module 108 may thus be configured to act as a go-between for IVD testers, diagnostic tools, and ECUs that are coupled to the same or different communication buses. Gateway module 108 may further be configured to receive requests from various IVD testers and diagnostic tools and grant access one at a time, so that multiple requests are not active at the same time and confusion over the source, destination, and/or requested information does not occur.

Vehicle 100 may also have one or more systems or devices configured to communicate with remote computing device 120. For instance, vehicle 100 may include one or more antennas, processor, and other systems or devices that enable wired or wireless communication via one or more communication protocols. Remote computing device 120 may be a server or other cloud based device configured to provide computing system updates to a computing system of vehicle 100. The remote computing device 120 may thus be controlled by the vehicle manufacturer, and configured to push updates to vehicle 100.

Figure 2:
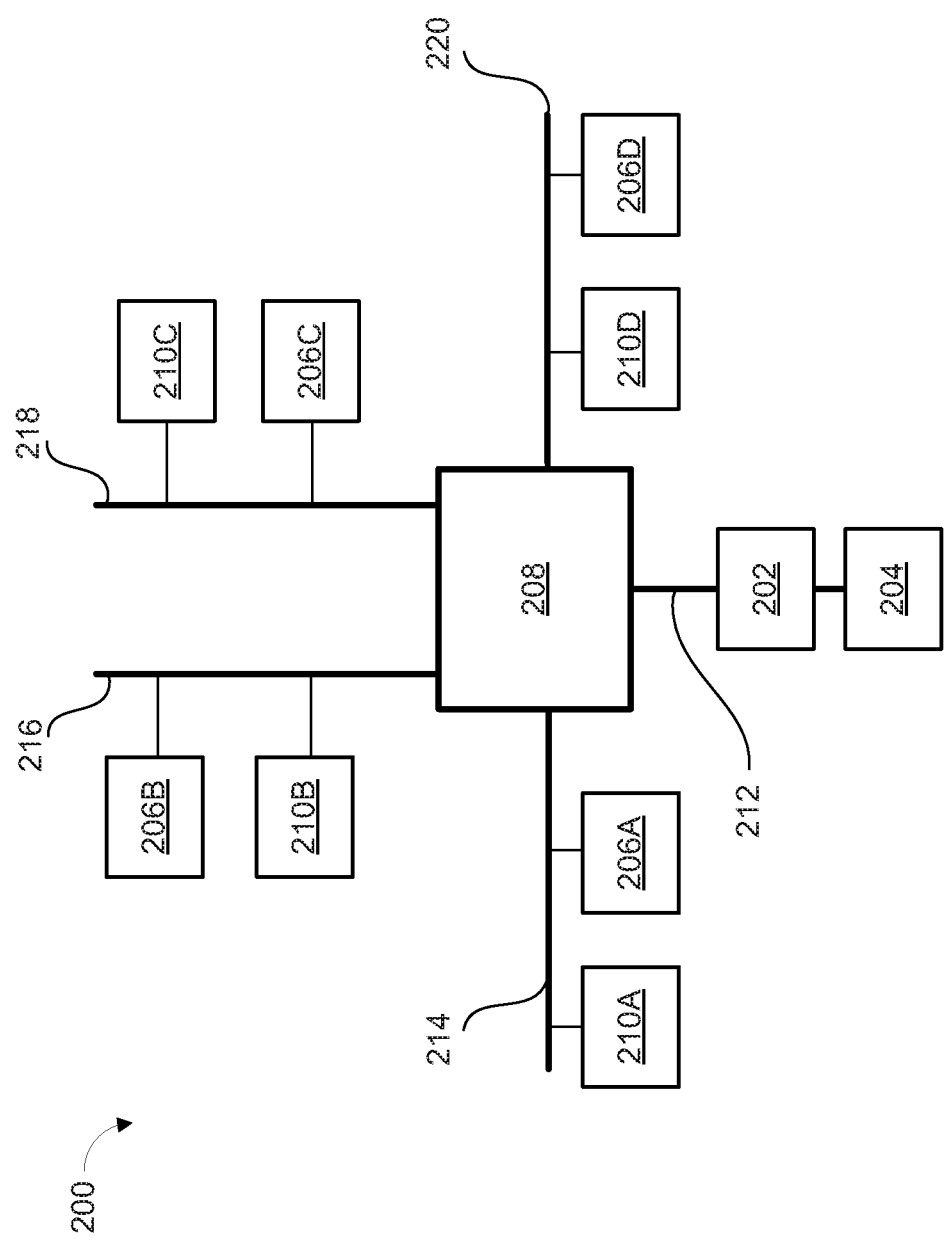
FIG. 2 illustrates an example block diagram of electronic components of the vehicle of FIG. 1.

FIG. 2 illustrates an example block diagram 200 showing electronic components of vehicle 100, according to some embodiments. In the illustrated example, the electronic components 200 include the gateway module 208, a plurality of IVD testers 206A-D, an off-board diagnostic tester port 202, and a plurality of ECUs 210A-D, all communicatively coupled via a plurality of communication buses 212, 214, 216, 218, and 220. FIG. 2 also illustrates a diagnostic tool 204 coupled to the off-board diagnostic tester port 202.

Each ECU, IVD tester, off-board diagnostic tester port, diagnostic tool, and/or the gateway module may include a microcontroller unit, controller or processor and a memory. The processor may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory includes multiple kinds of memory, particularly volatile memory and non-volatile memory.

The memory may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory, the computer readable medium, and/or within the processor during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

FIG. 2 illustrates that an example vehicle communication network 200 may include a plurality of communication buses 212-220. One or more of the buses may be high speed (e.g., 500 kbps or more), medium speed (e.g., 125 kbps) or any other speed. Each bus may be configured to couple one or more ECUs and/or IVD testers, which in some cases may be related (e.g., a given bus may couple the driver's seat module, driver's door module, and other driver side related ECUs).

Gateway module 208 may be configured to coordinate requests for information and/or communication with one or more ECUs by queuing the requests based on a time or arrival. In some examples, the gateway module 208 may determine a request priority, based on the ID of a requesting IVD tester, based on the ECU from which information is requested, or based on some other characteristic.

Gateway module 208 may be configured to enable communication with one or more IVD testers. In some examples, this may include enabling communication between a given IVD tester and a given ECU from which the IVD tester is requesting information. Alternatively, this may include the gateway module 208 facilitating communication between the IVD tester and one or more other systems or devices by receiving and relaying data transmitted by the IVD tester, which may include a request from the IVD tester for information from the ECU. The gateway module 208 may further be configured to receive and relay a response by an ECU back to the requesting IVD tester.

The gateway module may further be configured to perform a similar operation or function with respect to a diagnostic tool 204 coupled to the off-board diagnostic tester port 202. As such, the diagnostic tool 204 may transmit a request for information from an ECU via the port 202, and the gateway module 208 may relay the information to the particular ECU from which information is requested.

In some examples, gateway module 208 may be configured to prevent communication with one or more other IVD testers and/or the diagnostic tool 204/port 202 while facilitating communication with another IVD tester or diagnostic tool 204/port 202. In other words, the gateway module 208 may be configured to allow access to only one IVD tester or diagnostic tool 204 at a time, and while facilitating communication with that single tester/too, prevent other testers/tools from obtaining access or communicating with the ECUs.

Gateway module 208 may further be configured to determine that diagnostic tool 204 is coupled to the off-board diagnostic tester port 202 for a given period of time, such as a number of ignition cycles. As described above, issues may arise when a diagnostic tool is plugged in to the port for an extended period of time if the diagnostic tool is given priority in communicating with various ECUs. It may therefore be helpful to determine one or more characteristics of the diagnostic tool, in order to determine whether it should be allowed to communicate or not. Some of these characteristics may include the number of consecutive or non-consecutive ignition cycles for which a given diagnostic tool is plugged in, the type of information or ECU from which information is requested, and any initialization sequence performed, for example. These characteristics may be used to determine whether the diagnostic tool is a permanent or semi-permanent plug in, or whether it is a manufacturer or maintenance tool that is being used to diagnose the car in the short term (i.e., not over the course of days or weeks). As such, the gateway module may be configured to determine and store in a memory information regarding the duration, number of ignition cycles, or other characteristics of any plugged in diagnostic tools.

The gateway module may then compare that data to a threshold. For instance, the gateway module may use a threshold of five ignition cycles, such that actions can be taken based on whether the diagnostic tool 204 is plugged in for greater or less than five ignition cycles. It should be noted that smaller or greater thresholds may be used as well. Further, the threshold may change based on one or more characteristics of the diagnostic tool that are determined by the gateway module.

If the diagnostic tool is determined to have been plugged in for greater than the threshold, the gateway module may be configured to responsively prevent communication with the off-board diagnostic tester port. This may result in the diagnostic tool requesting communication with an ECU via the port, but being prevented from doing so by the gateway module. Further, while the diagnostic tool is prevented from communicating with the ECUs, the gateway module may facilitate or enable communication with one or more other IVD testers that request information. In this manner, the gateway module may prevent the diagnostic tool from constantly overriding other IVD testers and preventing them from accessing information from the ECUs.

In some examples, the diagnostic tool 204 and/or diagnostic tester port 202 may be prevented from communicating with an ECU for a given period of time. The period of time may include a duration of time (e.g., 10 minutes), or may include a number of ignition cycles. The ignition cycles may be consecutive (e.g., two in a row, after which communication with the diagnostic tester port 202 is restored), or may be non-consecutive (e.g., communication with the diagnostic tester port 202 is restored and prevented on alternating ignition cycles). Other patterns of ignition cycles and/or durations of time are possible as well.

In some examples, the gateway module 208 may be configured to receive an initialization sequence from the diagnostic tool 204 via the diagnostic tester port 202. The gateway module may then determine one or more characteristics of the diagnostic tool 204 based on the initialization sequence. For instance, the gateway module 208 may determine that the diagnostic tool 204 is an emissions tool, and may responsively modify the threshold number of ignition cycles. The threshold may be modified in order to allow the emissions tool to access the ECUs regardless of the number of ignition cycles that it is plugged in, so as to comply with any regulations or mandates for vehicle emissions standards.

Other diagnostic tool characteristics may be determined as well, and may be used as a basis to modify the threshold used by the gateway module.

While the example above may be described with respect to a number of ignition cycles being greater than a threshold, it should be noted that a duration of time may be used as well instead of or in addition to a number of ignition cycles. For instance, the threshold may include a number of ignition cycles within a period of time, such as one day. Or the threshold may include a number of ignition cycles over the course of several days, such that a diagnostic tool used by a repair shop that turns the vehicle on and off multiple times in rapid succession (while performing maintenance) is not prevented from accessing required information.

In some examples, the gateway module 208 may take one or more actions based on a determination that the diagnostic tool has been plugged in for less than the threshold number of ignition cycles. The vehicle may receive a message from a remote computing device indicating a request to provide an over-the-air vehicle software update. The update may be a safety or security update, in which case it would be beneficial for the IVD testers to have access to provide the remote computing device with access to the vehicle systems and information (rather than have them prevented from access because a diagnostic tool is plugged in.) If the message is received from the remote computing device, the gateway module may responsively prevent communication with the off-board diagnostic tester port and/or diagnostic tool regardless of whether the diagnostic tool has been plugged in for greater or less than a threshold number of ignition cycles or duration of time. This may then allow the remote computing device to access ECU information via the IVD testers, so that it can determine whether to provide an over-the-air software update, or what type of over-the-air software update should be provided.

Figure 3:
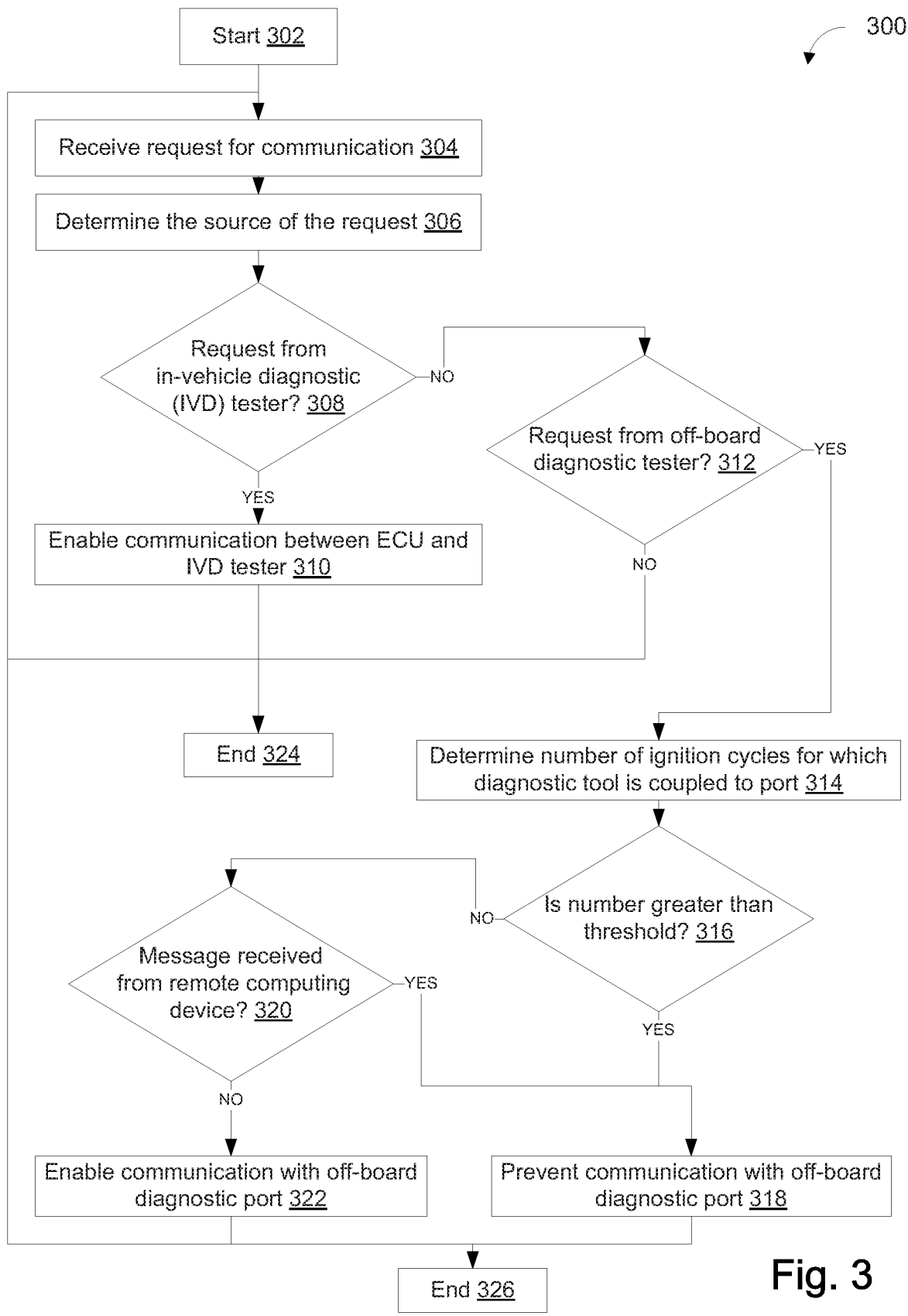
FIG. 3 illustrates a flowchart of an example method according to embodiments of the present disclosure.

FIG. 3 illustrates a flowchart of an example method 300 according to embodiments of the present disclosure. Method 300 may enable a vehicle having an IVD tester and an off-board diagnostic tester port to coordinate and process information requests for one or more ECUs on a plurality of communication buses. The flowchart of FIG. 3 is representative of machine readable instructions that are stored in memory and may include one or more programs which, when executed by a processor may cause vehicle 100 and/or one or more systems or devices to carry out one or more functions described herein. While the example program is described with reference to the flowchart illustrated in FIG. 3, many other methods for carrying out the functions described herein may alternatively be used. For example, the order of execution of the blocks may be rearranged or performed in series or parallel with each other, blocks may be changed, eliminated, and/or combined to perform method 300. Further, because method 300 is disclosed in connection with the components of FIGS. 1-2, some functions of those components will not be described in detail below.

Method 300 may start at block 302. At block 304, method 300 may include receiving a request for communication with an ECU. The request may be received from an IVD tester or a diagnostic tool plugged into the off-board diagnostic tester port. The request may be received by the gateway module.

At block 306, method 300 may include determining the source of the request. This can include determining whether the request was sent from an IVD tester, the diagnostic tool, and/or other information related to the source such as which communication bus it is coupled to, the ECU from which information is requested, and more.

At block 308, method 300 may include determining whether the request came from an IVD tester. If the request did come from an IVD tester, method 300 may include enabling communication between the IVD tester and the requested ECU at block 310. Method 300 may then proceed back to block 304, or may end at block 324.

If the request did not come from an IVD tester, block 312 may include determining whether the request came from the off-board diagnostic tester port. If the request did not come from the off-board diagnostic tester port, method 300 may proceed back to block 304, or may end at block 324.

But if the request did come from the off-board diagnostic tester port, block 314 of method 300 may include determining a number of ignition cycles for which the diagnostic tool is coupled to or plugged into the port. Method 300 may then include comparing the determined number of ignition cycles to a threshold at block 316.

If the diagnostic tool has been plugged in for greater than the threshold number of ignition cycles, method 318 may include preventing communication with the off-board diagnostic tester port and/or diagnostic tool. It may further include enabling or facilitating communication between one or more IVD testers and an ECU.

Block 320 of method 300 may include determining whether a message has been received from a remote computing device, wherein the message indicates a request to provide an over-the-air vehicle software update. If a message has been received, the gateway module may prevent communication with the off-board diagnostic tester port and/or diagnostic tool, to allow one or more IVD testers to request and receive information that may be used by the remote computing device. The remote computing device may then determine whether to provide an update, or which update should be provided, based on the information gathered by the IVD testers while the off-board diagnostic tester port and/or diagnostic tool is prevented from communicating.

However if the diagnostic tool has been plugged in for less than the threshold number of ignition cycles, and no message has been received, method 300 may include enabling communication between the diagnostic tester port and/or diagnostic tool and one or more ECUs at block 322. Method 300 may the proceed back to block 304, or may end at block 326.

In some examples, priority may be initially given to an off-board diagnostic tool whenever it is plugged in. This is because it may be unknown initially whether the tool is a service too, dealership tool, emissions tool, or other tool to which deference should be given. Then when checking or determining whether a received request is from an IVD, the gateway module may check to determine whether an communication is currently happening with an off-board diagnostic tool. If there is communication currently with the tool, the number of ignition cycles that the tool has been plugged in may be checked. If the number of cycles is greater than the threshold, the gateway module may block communication with the off-board diagnostic tool. However if no IVD has requested access, the gateway module may not prevent access to the off-board diagnostic tool even where the tool has been plugged in for greater than the threshold number of ignition cycles.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
an off-board diagnostic tester port;
an in-vehicle diagnostic (IVD) tester; and
a processor; and
a memory storing computer-executable instructions, that when executed by the processor, cause the processor to:
enable communication with the IVD tester;
determine that a diagnostic tool is coupled to the off-board diagnostic tester port for greater than a threshold amount of time; and
responsively prevent communication with the off-board diagnostic tester port.

2. The vehicle of claim 1, further comprising an electronic control unit (ECU), wherein the computer-executable instructions further cause the processor to receive a request from the diagnostic tool for information from the ECU.

3. The vehicle of claim 2, wherein the computer-executable instructions further cause the processor to prevent communication with the IVD tester while communication between the diagnostic tool and the ECU is enabled.

4. The vehicle of claim 1, wherein the computer-executable instructions further cause the processor to prevent communication with the off-board diagnostic tester port for a predetermined time period.

5. The vehicle of claim 4, wherein the predetermined time period comprises one or more consecutive ignition cycles.

6. The vehicle of claim 4, wherein the predetermined time period comprises one or more non-consecutive ignition cycles.

7. The vehicle of claim 1, wherein the computer-executable instructions further cause the processor to:
receive an initialization sequence from the diagnostic tool;
determine that the diagnostic tool is an emissions tool based on the initialization sequence; and
responsively modify the threshold amount of time.

8. The vehicle of claim 1, wherein the computer-executable instructions further cause the processor to:
determine that the diagnostic tool is coupled to the off-board diagnostic tester port for less than the threshold amount of time;
receive a message from a remote computing device, the message indicating a request to provide an over-the-air vehicle software update; and
responsively prevent communication with the off-board diagnostic tester port.

9. The vehicle of claim 1, wherein the computer-executable instructions further cause the processor to enable communication between an electronic control unit (ECU) and only one of the IVD tester and the off-board diagnostic tester port at a given time.

10. The vehicle of claim 1, wherein the IVD tester is coupled to a first communication bus, and the off-board diagnostic tester port is coupled to a second communication bus.

11. A method for controlling diagnostic testers of a vehicle comprising:
    enabling, by a processor, communication with an in-vehicle diagnostic (IVD) tester;
    determining that a diagnostic tool is coupled to an off-board diagnostic tester port for greater than a threshold number of ignition cycles; and
    responsively preventing communication with the off-board diagnostic tester port.

12. The method of claim 11, further comprising receiving, by the processor, a request from the diagnostic tool for information from an electronic control unit (ECU).

13. The method of claim 12, further comprising preventing communication with the IVD tester while enabling communication between the diagnostic tool and the ECU.

14. The method of claim 11, further comprising preventing communication with the off-board diagnostic tester port for a predetermined time period.

15. The method of claim 14, wherein the predetermined time period comprises one or more consecutive ignition cycles.

16. The method of claim 14, wherein the predetermined time period comprises one or more non-consecutive ignition cycles.

17. The method of claim 11, further comprising:
    receiving, by the processor, an initialization sequence from the diagnostic tool;
    determining that the diagnostic tool is an emissions tool based on the initialization sequence; and
    responsively modifying the threshold number of ignition cycles.

18. The method of claim 11, further comprising:
    determining that the diagnostic tool is coupled to the off-board diagnostic tester port for less than the threshold number of ignition cycles;
    receiving a message from a remote computing device, the message indicating a request to provide an over-the-air vehicle software update; and
    responsively preventing communication with the off-board diagnostic tester port.

19. The method of claim 11, further comprising:
    enabling communication between an electronic control unit (ECU) and only one of the IVD tester and the off-board diagnostic tester port at a given time.

20. The method of claim 11, wherein the IVD tester is coupled to a first communication bus, and the off-board diagnostic tester port is coupled to a second communication bus.

* * * * *